United States Patent [19]
Naziripour et al.

[11] Patent Number: 5,306,703
[45] Date of Patent: Apr. 26, 1994

[54] METHOD OF FORMING SMOOTH, UNIFORM THALLIUM-BASED SUPERCONDUCTING FILMS

[75] Inventors: Ali Naziripour, Boulder; Allen M. Hermann, Golden, both of Colo.

[73] Assignee: The University of Colorado Foundation, Inc., Boulder, Colo.

[21] Appl. No.: 889,599

[22] Filed: May 27, 1992

[51] Int. Cl.$^5$ ............................................. B05D 5/12
[52] U.S. Cl. .................................. 505/470; 505/730; 505/732; 505/742; 427/62; 427/404; 427/405
[58] Field of Search .................. 505/1, 730, 783, 732, 505/742; 427/62, 63, 404, 405

[56] References Cited
PUBLICATIONS

Ginley et al, "Superconducting Thim Films of $Tl_2CaBa_2Cu_3O_y$ and $Tl_2CaBa_2O_y$", Physica C 156 (1988) pp. 592–598.

Denhoff et al, "Effects of annealing on $TlBa_2CaCuO$ thin films", Appl. Phys. Lett. 54 (7) Feb. 1989 pp. 660–662.

Adachi et al, "Superconducting Thin Films of Bi-Sr-Ca-Cu-O and Tl-Ba-Ca-Cu-O with Tc above 100 K", Journal of Crystal Growth 91 (1988) Aug., No. 3, pp. 352–354.

Primary Examiner—Roy King
Attorney, Agent, or Firm—Flehr, Hohbach, Test, Albritton & Herbert

[57] ABSTRACT

A method of forming thallium, barium, calcium, copper oxide films with smooth surfaces and chemical uniformity by sequentially depositing layers and annealing in the absence of a separate source of Tl.

3 Claims, 2 Drawing Sheets

METHOD OF FORMING SMOOTH, UNIFORM THALLIUM-BASED SUPERCONDUCTING FILMS

BRIEF DESCRIPTION OF THE INVENTION

This invention relates generally to the formation of thallium superconducting thin films, and more particularly, to the formation of thallium-based superconducting thin films without using an external source of thallium during post-deposition anneal.

BACKGROUND OF THE INVENTION

Thallium superconducting films have high transition temperatures. Thallium superconducting films having chemical uniformity and smooth surfaces are particularly desirable for high frequency microwave conductors operating at high critical current densities. High frequency microwave conductors are particularly useful for the fabrication of high-Q microwave cavities. High current densities also provide efficient interconnections for high power applications such as energy transmission and storage.

OBJECTS AND SUMMARY OF THE INVENTION

It is a general object of this invention to provide a method for fabricating thallium-based superconducting thin films having chemical uniformity and smooth surfaces.

It is another object of this invention to provide a method of forming thallium-based superconducting thin films without the use of excess thallium from a separate source during post deposition anneal.

It is yet another object of this invention to provide a method of forming superconducting thallium-based thin films that use repetitious sequential deposition steps of copper, barium, calcium and thallium.

The foregoing and other objects of the invention are achieved by a method of forming thallium, barium, calcium, copper, oxide layers or films with smooth surfaces and chemical uniformity by sequentially depositing layers of copper, barium, calcium and thallium to predetermined thicknesses, repeating the deposition of the sequential layers until the desired layer thickness is obtained, depositing a final copper layer to the predetermined thickness, thereafter heating the layered structure in a nearly closed copper container at an elevated temperature in the presence of oxygen for a predetermined time and then allowing the assembly to cool to room temperature.

BRIEF DESCRIPTION OF THE DRAWINGS

The foregoing and other objects of this invention will be more clearly understood from the following description when read in conjunction with the accompanying drawings, wherein.

DESCRIPTION OF PREFERRED EMBODIMENTS

We have discovered that a chemically uniform superconducting thallium film having a smooth surface can be fabricated by repetitively depositing sequential layers of copper, barium, calcium, and thallium, and then annealing the resulting film.

More specifically, sequential layers are deposited onto a suitable substrate such as magnesium oxide (MgO) or strontium titanium oxide ($SrTiO_3$) by sequentially electron-beam evaporating and condensing selected elements onto the surface of the substrate in a vacuum chamber. Each element is sequentially evaporated and deposited to a predetermined thickness to establish the stoichiometry of the composite layer. More particularly, the film is formed by electron-beam evaporating sequentially copper, barium, calcium and thallium in a vacuum chamber and allowing the elements to sequentially condense on the surface of a substrate to a thickness which establishes the desired stoichiometry, and then repeating the process a number of times to form a film of desired thickness and stoichiometry. The deposition process is completed by the deposition of a top layer of copper. The substrate and multiple layer film is then placed in a nearly closed copper container having a vent hole. Oxygen is fed into the container as the container is heated and maintained at an elevated temperature whereby the multiple layered film is annealed. The container is then removed from the oven and the substrate and film are allowed to slowly cool.

Figure 1:
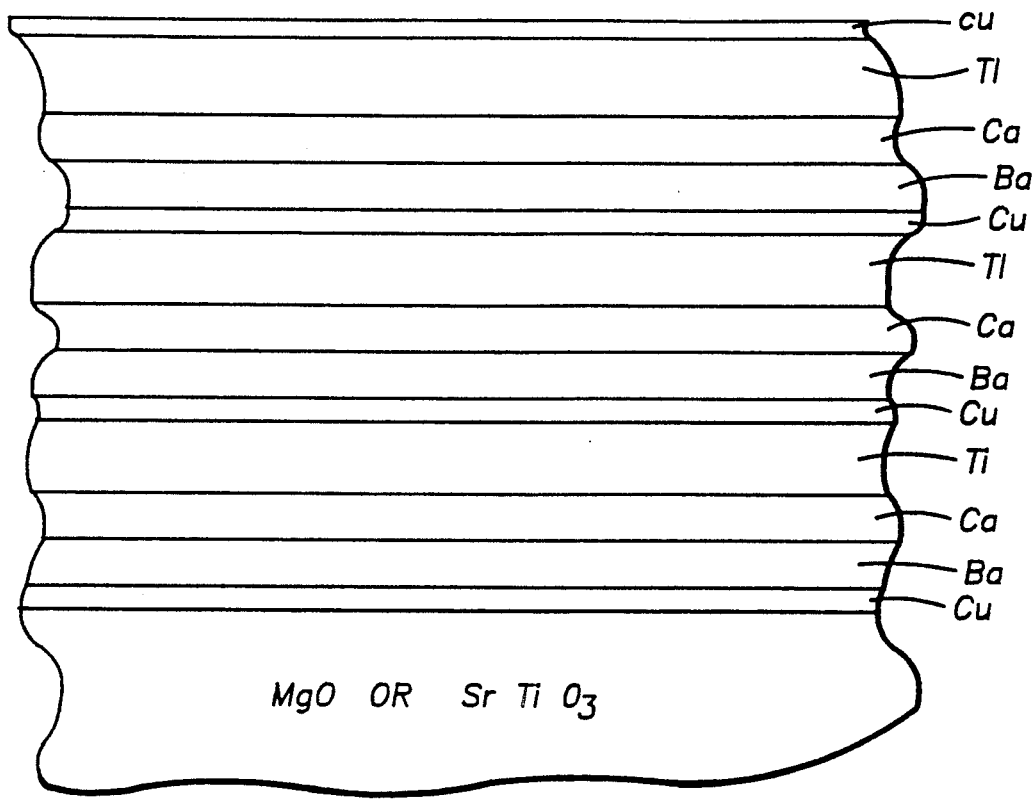
FIG. 1 is a cross-sectional view of a section of a film formed in accordance with this invention.
Figure 2:
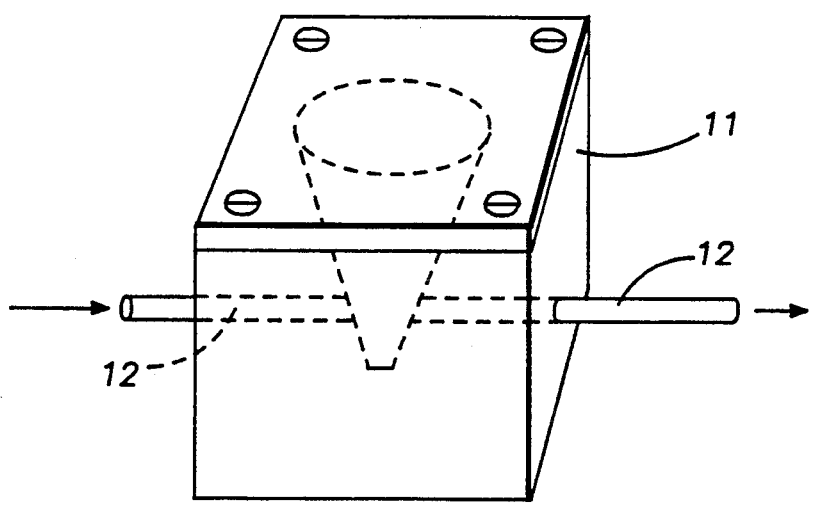
FIG. 2 shows a closed copper container.
Figure 3:
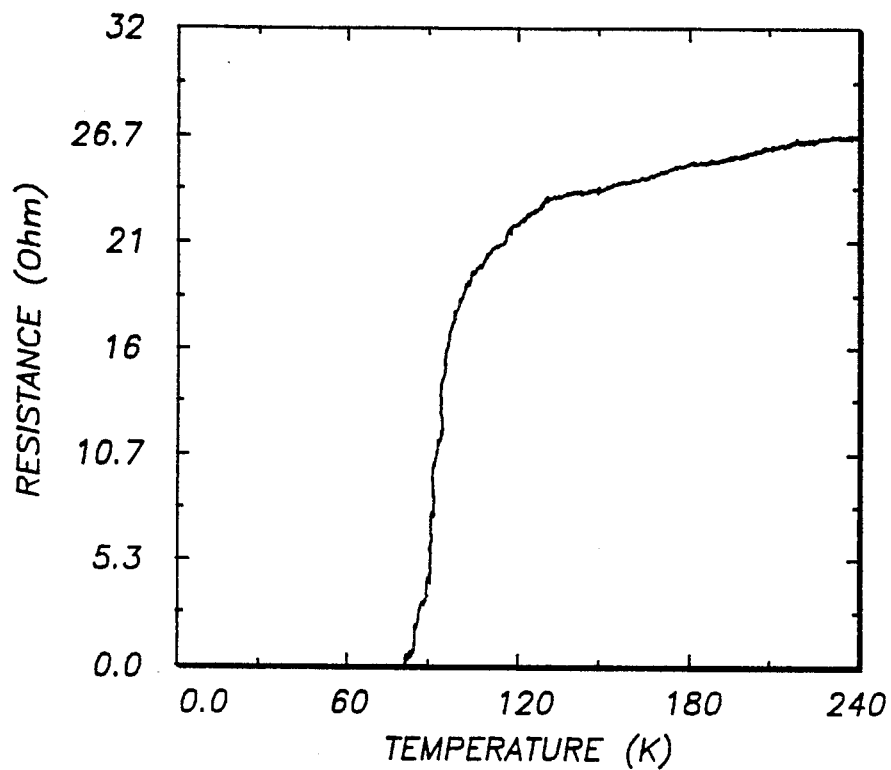
FIG. 3 shows the resistance versus temperature characteristics of a film formed in accordance with this invention.
Figure 4:
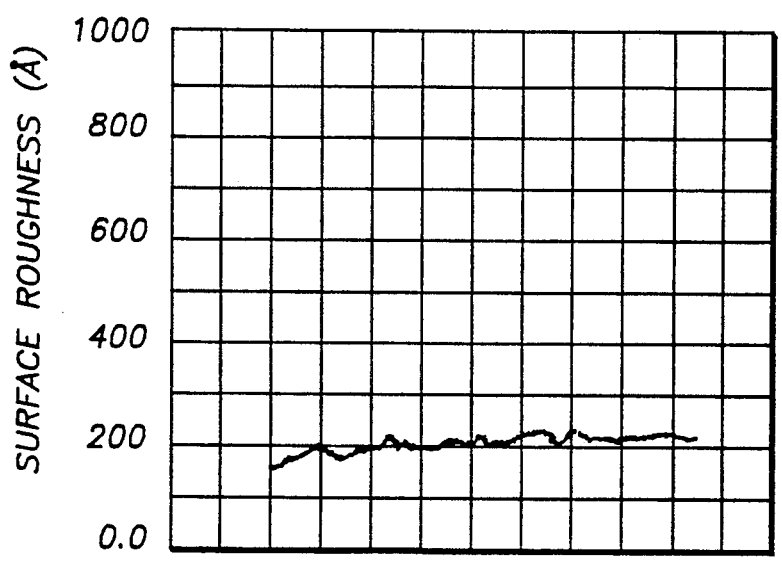
FIG. 4 shows the profilometer traces for a film in accordance with the invention.

In one example, shown in FIG. 1, layers of copper, barium, calcium and thallium were sequentially deposited or condensed at thicknesses of 171Å, 737Å, 500Å and 850Å, respectively. The sequential deposit was repeated three times and then the multilayer film was capped with a copper layer having a thickness of 171Å. The film and substrate were then placed in a closed copper container 11 having one-millimeter diameter vent openings 12, FIG. 2, and oxygen was fed into the container while the container was placed in a furnace at 820° C. for ten minutes. Based on the starting composition layer thickness, the film would be expected to have the composition $Tl_2Ba_2Ca_2Cu_3O_x$. However, the film was found to have a composition $Tl_{1.63}Ba_{1.65}Ca_{1.9\text{-}9}Cu_3O_x$, by electron probe analysis. Stoichiometry was found to be substantially uniform across the face of the film. The resistance temperature characteristics are shown in FIG. 3 with a zero-resistance temperature of 82° K apparent. A profilometry trace, FIG. 4, shows that the film is uniform with maximum surface variations of ±150Å. The critical current density of the film was $1.5 \times 10^4$ A/cm$^2$ at 77° K in zero magnetic field.

We have found that the preferable annealing temperature is in the range of 800°–850° C. with annealing times in the range of 5 to 20 minutes. This produces relatively uniform chemical compositions and smooth surfaces.

Thus, there has been provided a method for growing thallium-based superconductor films of desired thickness and stoichiometry and chemical uniformity. The film has a smooth surface and is particularly useful in microwave applications. The films may be grown on both sides of a substrate or grown to conform to surfaces of various configurations because of the manner of deposition.

What is claimed is:

1. A method of forming a thallium, barium, calcium, copper oxide superconducting film with smooth surfaces and chemical uniformity comprising the steps of:

sequentially depositing layers of copper, barium, calcium and thallium to a thickness, repeating the deposition of sequential layers until a final layer thickness is obtained, depositing a final copper capping layer, heating the layered structure at a temperature in the range of 800°–850° C. in the absence of a separate source of Tl for a time period of 5 to 20 minutes in a container while introducing oxygen into the container and then allowing the substrate to cool to room temperature.

2. The method of claim 1 in which the sequential layer of Cu, Ba, Ca and Tl has the following thickness, respectively: 171Å, 737Å, 500Å and 850Å.

3. The method of claim 2 wherein the layered structure is heated to 810°±10° for a period of ten minutes or less.

* * * * *